US005142696A

United States Patent [19]

Kosiec et al.

[11] Patent Number: 5,142,696

[45] Date of Patent: Aug. 25, 1992

[54] CURRENT MIRROR HAVING INCREASED OUTPUT SWING

[75] Inventors: Jeannie H. Kosiec, Schaumburg; Steven F. Gillig, Roselle, both of Ill.

[73] Assignee: Motorola, Inc., Schaumburg, Ill.

[21] Appl. No.: 686,213

[22] Filed: Apr. 16, 1991

[51] Int. Cl.[5] .......... H04B 7/00; G05F 3/16; H03F 3/04

[52] U.S. Cl. .......... 455/260; 323/315; 330/288

[58] Field of Search .......... 455/260, 183; 323/315; 330/288

[56] References Cited

U.S. PATENT DOCUMENTS

| | | | |
|---|---|---|---|
| 4,550,284 | 10/1985 | Sooch | 323/315 |
| 4,912,433 | 3/1990 | Moregi et al. | 455/260 |

FOREIGN PATENT DOCUMENTS

| | | | |
|---|---|---|---|
| 0108410 | 6/1984 | Japan | 330/288 |
| 0853623 | 8/1981 | U.S.S.R. | 323/315 |
| 2039184 | 7/1980 | United Kingdom | 323/288 |

*Primary Examiner*—Curtis Kuntz
*Assistant Examiner*—Christine Belzer
*Attorney, Agent, or Firm*—Robert H. Kelly

[57] ABSTRACT

A current mirror having improved turn-on and turn-off characteristics capable of operation an expanded voltage range. A cascode circuit comprising a portion of the current mirror is of a high characteristic impedance to increase thereby the voltages over which the current mirror may generate a constant current output. A switching circuit comprised of tandemly-positioned transistors having differing transistor characteristics decreases the transistor turn-on and turn-off times to enhance the characteristics of the current mirror.

14 Claims, 4 Drawing Sheets

120

FIG. 1
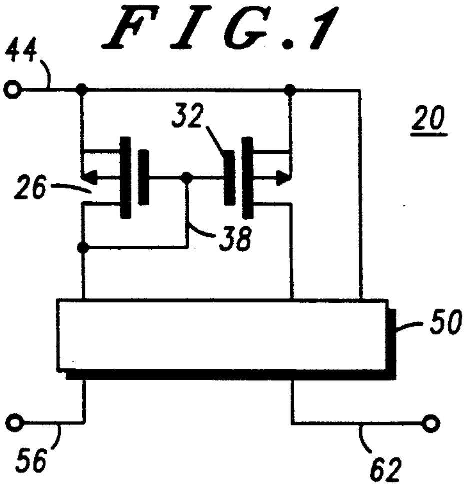
FIG. 2
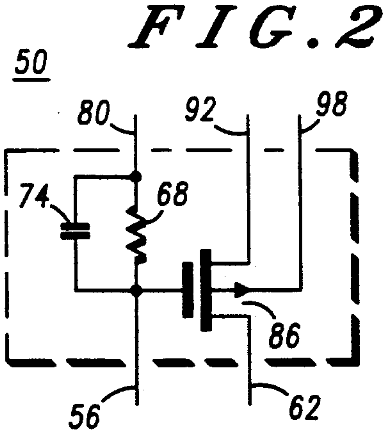
FIG. 6
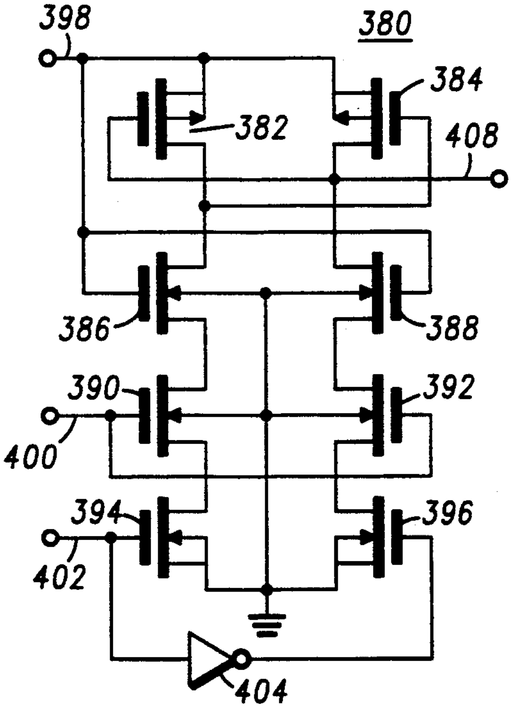
FIG. 3
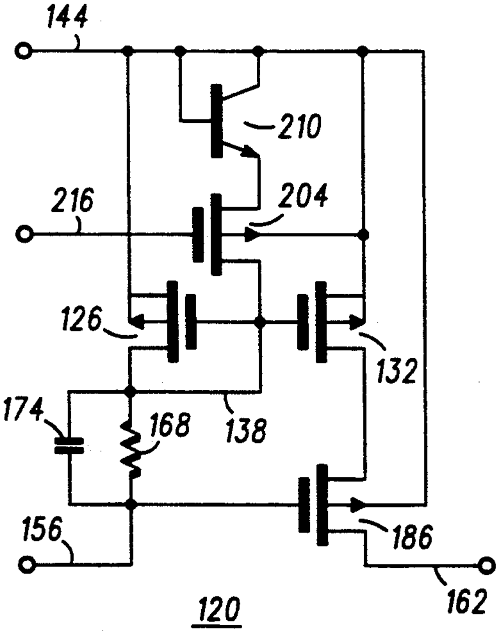
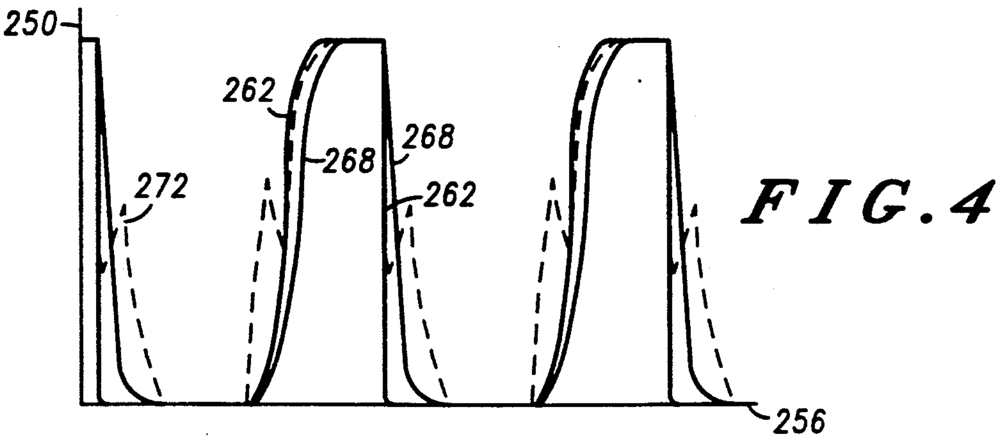
FIG. 4

470

420

550

CURRENT MIRROR HAVING INCREASED OUTPUT SWING

BACKGROUND OF THE INVENTION

The present invention relates generally to current mirror circuitry, and, more particularly, to an improved current mirror having a cascode circuit forming a portion thereof permitting the current mirror to generate a constant-current output signal over an increased voltage range.

A communication system which transmits information between two locations includes, at a minimum, a transmitter and a receiver interconnected by a transmission channel. An information signal is transmitted by the transmitter upon the transmission channel, and the transmitted, information signal is received by the receiver to effectuate transmission of the information between the two locations.

A radio communication system comprises one type of communication system. In a radio communication system, the transmission channel is formed of a radio-frequency channel wherein the radio-frequency channel is defined by a range of frequencies of the electromagnetic frequency spectrum. In order for a transmitter of a radio communication system to transmit an information signal upon the radio-frequency channel, the information signal must be converted by the transmitter into a form suitable to allow transmission of the information signal upon the radio-frequency channel.

A process, referred to as modulation, converts the information signal into such form suitable to allow transmission thereof upon the radio-frequency channel. The transmitter contains circuitry to perform such modulation. In general, in a modulation process, an information signal is impressed (commonly referred to as "modulated") upon a radio-frequency electromagnetic wave. The radio-frequency, electromagnetic wave upon which the information signal is impressed (i.e., modulated) is commonly referred to as a "carrier signal", and the radio-frequency, electromagnetic wave, once modulated by the information signal, is referred to as a modulated, information signal, or, more simply, a modulated signal.

The modulated signal formed as a result of such a modulation process encompasses a range of frequencies centered at, or close to, the characteristic frequency of the carrier signal. The range of frequencies forming the bandwidth of the modulated signal is sometimes referred to as a modulation spectrum.

The modulated signal may be transmitted through free space upon the radio-frequency channel to transmit thereby the information signal between the transmitter and the receiver to effectuate the transmission of the information signal therebetween. Therefore, the transmitter and the receiver of a radio-frequency communication system need not to be positioned in close proximity to one another. As a result, radio communication systems are widely utilized to effectuate communication between a transmitter and a remotely-positioned receiver.

Many types of modulation techniques have been developed to modulate an information signal upon a carrier signal to form thereby the modulated signal. Such modulation techniques include, for example, amplitude modulation (AM), frequency modulation (FM), phase modulation (PM), frequency-shift keying modulation (FSK), phase-shift keying modulation (PSK), and continuous phase modulation (CPM).

The receiver of the radio communication system which receives the modulated signal transmitted upon the transmission channel by the transmitter contains circuitry to detect, or to recreate otherwise, the information signal modulated upon the carrier signal. Such circuitry, commonly referred to as demodulation circuitry, performs a process which, in essence, is the reverse of the modulation process utilized to form the modulated signal. The demodulation circuitry of the receiver, therefore, is of a construction corresponding to the type of modulation process utilized to form the modulated signal received by the receiver.

A plurality of modulated signals may be simultaneously transmitted as long as the simultaneously-transmitted, modulated signals do not overlap in frequency or otherwise do not interfere with one another. Modulated signals formed of carrier signals of dissimilar frequencies ensure that simultaneously-transmitted, modulated signals do not overlap in frequency.

Regulatory bodies have divided portions of the electromagnetic frequency spectrum into frequency bands, and have regulated transmission of modulated signals upon most of such defined frequency bands. The frequency bands have further been divided into channels, and such channels form the radio-frequency channels of a radio communication system. The defined radio-frequency channels are of bandwidths which ensure that a modulated signal centered thereupon does not interfere with a modulated signal simultaneously transmitted upon an adjacent channel. Regulation of transmission of modulated signals upon radio-frequency channels of the regulated frequency band minimizes interference between simultaneously-transmitted, modulated signals.

Both the modulation circuitry of the transmitter and the demodulation circuitry of the receiver contains mixing circuitry. Mixing circuitry of the modulation circuitry up-converts in frequency the information signal to form the modulated signal therefrom, and mixing circuitry of the demodulation circuitry down-converts in frequency a modulated signal to recreate the information signal therefrom.

Modulation circuitry converts the information signal, which is of a low (i.e., baseband) frequency, into a modulated signal of a transmission frequency having a modulation spectrum which must be of a bandwidth less than the bandwidth of a radio-frequency channel upon which the modulated signal is to be transmitted. The oscillating signals generated by the oscillators which are supplied to the mixing circuitry to up-convert the information signal in frequency must generate oscillating signals of precise frequencies to ensure that the modulation spectrum of the resultant, modulated signal is of such a bandwidth.

Oscillating signals of incorrect frequencies supplied to the various mixing circuitry can result in the resultant, modulated signal having a modulation spectrum beyond the range of frequencies defining the bandwidth of the radio-frequency channel upon which the modulated signal is to be transmitted.

To minimize such occurrences, transmitter circuitry frequently also includes phase locked loop circuitry which forms a feedback loop. Typically, the modulation circuitry of the transmitter includes mixer circuits to up-convert the information signal to a transmission frequency. Modulation circuitry having such a phase locked loop typically includes more than one oscillator in which one of the oscillators forms a reference oscillator to which other oscillators of the modulation circuitry are maintained in a frequency relationship. The phase locked loop compares the oscillating frequency of the reference oscillator with the oscillating frequency of the oscillating signals supplied to the mixing circuitry. Responsive to such comparison, the oscillating frequency of the oscillating signal applied to the mixing circuitry is altered. Such a feedback loop ensures that the oscillator which generates an oscillating signal supplied to mixer circuitry is of a desired frequency relative to an oscillating frequency of the reference oscillator of the transmitter.

Demodulation circuitry converts a modulated signal, of a transmission frequency, into a signal of a baseband frequency to permit recreation of the information signal. The demodulation circuitry of a receiver (analogous to the modulation circuitry of a transmitter) includes oscillators which generate oscillating signals which are supplied to mixing circuitry to down-convert in frequency a modulated signal received by the receiver, as above described, to recreate the information signal therefrom. Typically, the mixing circuitry of a receiver includes mixer circuits to down-convert a modulated signal to recreate the information signal therefrom. The oscillating signals generated by such oscillators must also be of precise frequencies to ensure proper recreation of the information signal subsequent to reception of a modulated signal.

Phase locked loop circuitry forming a feedback loop is also, therefore, frequently utilized to form a portion of the receiver circuitry. The mixing circuitry typically includes more than one oscillator in which one of the oscillators forms a reference oscillator to which other oscillators of the mixing circuitry are maintained in a frequency relationship. The phase locked loop compares the oscillating frequency of the reference oscillator with the oscillating frequency of the oscillating signals supplied to the mixing circuitry. Responsive to such comparison, the oscillating frequency of the oscillating signal applied to the mixing circuitry is altered.

Transceivers, such as two-way radios and radiotelephones are comprised of both a transmitter and a receiver forming transmitter portions and receiver portions of the transceiver, respectively. Transceivers typically include a single reference oscillator which generates an oscillating signal to which the oscillators of both the transmitter portions and the receiver portions of the transceiver are maintained in a desired frequency relationship. The transmitter portions and receiver portions, however, typically contain separate phase locked loop circuitry, as above described, to maintain the oscillating signals supplied to the mixing circuitry of the respective portions of the transceiver in the desired frequency relationships with the reference oscillator.

The oscillators which generate oscillating signals which are supplied to the mixing circuitry of the modulator of the transmitter and the demodulator of the receiver, respectively, are typically formed of voltage-controlled oscillators (VCOs) in which alterations of the frequencies of the oscillating signals generated therefrom may be varied by varying the level of a voltage signal applied thereto. Such alteration is sometimes referred to as "warping" of the oscillator. The phase locked loop circuitry, which forms the feedback control system, maintains the voltage controlled oscillator in the known frequency relationship with the reference oscillator.

The phase locked loop typically includes phase detector circuitry which is supplied with signals indicative of both the oscillating signal generated by the reference oscillator and signals indicative of the oscillating frequency of the voltage controlled oscillator. The phase detector compares the phases of the signals supplied thereto and generates a phase difference signal responsive to such comparisons. Such signal is typically supplied to a current mirror forming a portion of a charge pump. The charge pump generates the signals which are supplied to the voltage controlled oscillator (usually through a loop filter) to warp the frequency of the voltage control oscillator as needed.

The charge pump, of which the current mirror forms a portion, generates a current signal which may be of any of various voltages. The maximum voltage level at which a current mirror can generate an output signal is limited by the level of a source voltage less voltage drops across the current mirror circuitry. This is also the maximum voltage level of the output current signals generated by the charge pump.

Any increase in the range of voltages (and, more particularly, the maximum voltage level) of which the output current signal may be comprised reduces the sensitivity required of the voltage control oscillator. Such decrease in sensitivity required of the voltage controlled oscillator permits better control of the oscillating signal generated by the voltage controlled oscillator.

As the maximum voltage level of the output signal is related to the output impedance of the current mirror, an increase in such impedance level can improve the range of voltages over which the output signal may be generated. When the current mirror is comprised of a metal oxide semiconductor material, a high output impedance may be obtained by increasing the device length, i.e., by increasing length of the transistor. However, when the transistor length is increased, the width of the transistor must also be increased to prevent diminution of other transistor characteristics. An increase in the transistor width or length, however, increases the size of a gate electrode of the transistor, and the capacitance of the gate increases, and such increase results in slower rise and fall times of a current mirror formed therefrom.

Conventional cascode arrangements may be coupled to the current mirror. However, the maximum voltage level at which a current signal may be generated at the output of a current mirror when coupled thereto is reduced by the voltage drops across the transistors which comprise the conventional cascode arrangements.

What is needed, therefore, is an improved current mirror capable of generating a current signal over an increased range of voltages.

SUMMARY OF THE INVENTION

The present invention, therefore, advantageously provides an improved current mirror capable of generating an output current signal over an increased range of voltages.

The present invention further advantageously provides a charge pump having a current mirror capable of generating a current signal over an increased range of voltages.

The present invention yet further advantageously provides a phase locked loop circuit.

The present invention further provides a receiver of improved characteristics.

The present invention further provides a transmitter of improved characteristics.

The present invention provides further advantages and features, the details of which will become more apparent by reading the detailed description of the preferred embodiments hereinbelow.

In accordance with the present invention, therefore, a current mirror supplied with a source voltage for generating an output signal of desired current characteristics responsive to an input current signal supplied thereto is disclosed. The current mirror comprises at least one parallel-connected transistor pair coupled to receive the source voltage. A cascode circuit is coupled to the at least one parallel-connected transistor pair. The cascode circuit receives the input current signal, and includes a pre-determined impedance coupled to a first transistor of the parallel-connected transistor pair for supplying the input current signal received thereat to a first transistor of the parallel-connected transistor pair at voltage levels corresponding to voltage levels of the input current signal less a potential difference determined by the pre-determined impedance thereof. Means positioned in tandem with the second transistor of the parallel-connected transistor pair forms an output signal of high impedance.

BRIEF DESCRIPTION OF THE DRAWINGS

The present invention will be better understood when read in light of the accompanying drawings which:

FIG. 1 is a partial circuit, partial block diagram of the current mirror of a preferred embodiment of the present invention;

FIG. 2 is a circuit diagram of a cascode circuit forming a portion of the current mirror of the preferred embodiment of FIG. 1;

FIG. 3 is a circuit diagram of the current mirror of a preferred embodiment of the present invention having the cascode circuit of FIG. 2;

FIG. 4 is a graphical representation of a signal generated by the current mirror of FIG. 4 and a corresponding signal generated by a current mirror of conventional construction;

FIG. 6 is a circuit diagram of a portion of the charge pump shown in block form in FIG. 5;

DESCRIPTION OF PREFERRED EMBODIMENTS

Figure 5:
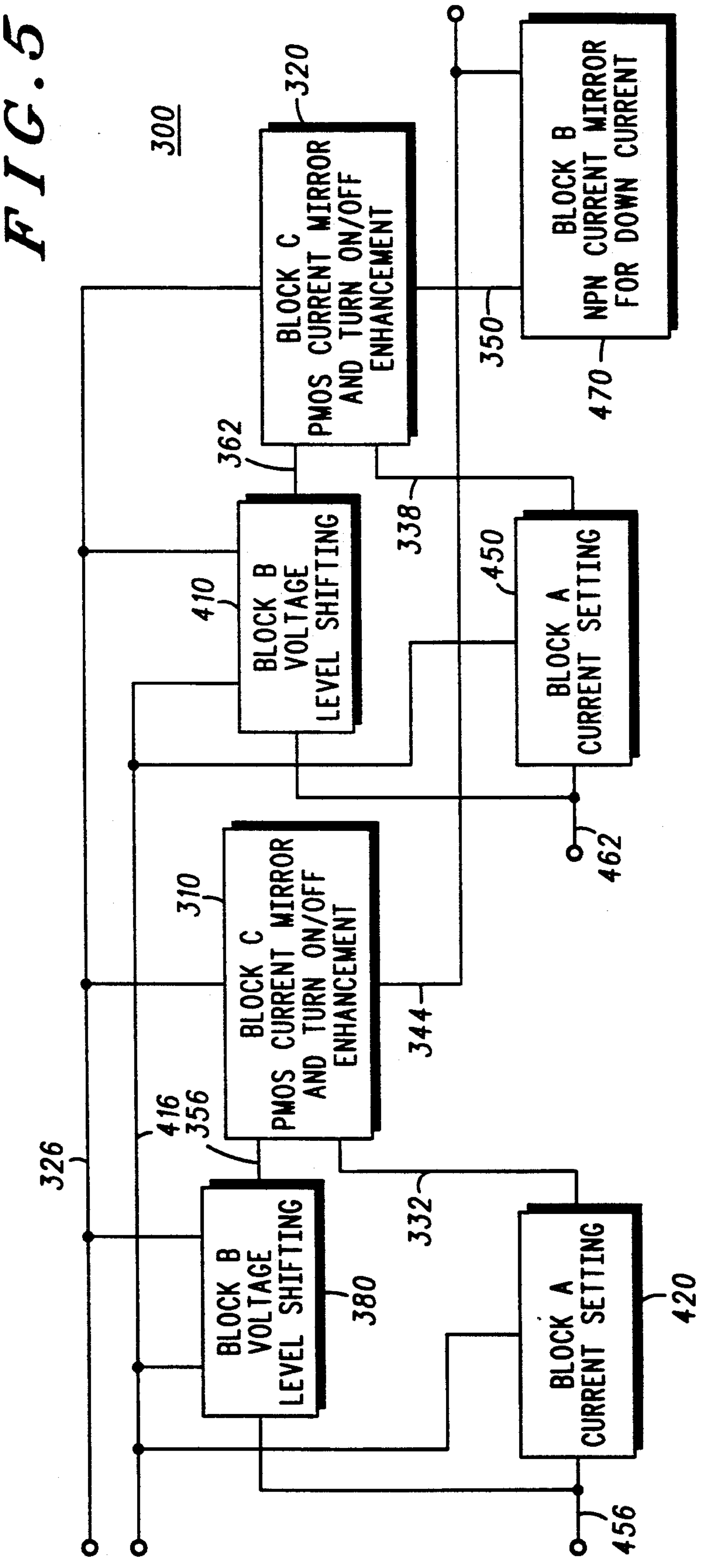
FIG. 5 is a block diagram of a charge pump of a preferred embodiment of the present invention having the current mirror of FIG. 3 comprising a portion thereof.

Referring first to the partial circuit, partial block diagram of FIG. 1, the current mirror, referred to generally by reference numeral 20, of a preferred embodiment of the present invention is shown. Current mirror 20 is comprised of a pair of transistors, here first transistor 26 and second transistor 32. Transistors 26 and 32 forming the transistor pair are formed of metal oxide semiconductor field effect transistors (MOSFETs) having gate electrodes thereof connected theretogether.

The gate and drain electrodes of first transistor 26 are short circuited theretogether such that the transistor pair comprised of transistors 26–32 together form a conventional current mirror. The source electrodes of transistors 26 and 32 are coupled to a source voltage, supplied on line 44. The source voltage supplied on line 44 may, for example, be of a voltage level of nine volts. The drain electrodes of transistors 26 and 32 (as well as the gate electrodes thereof by way of line 38) are coupled to cascode circuit 50, shown in block form in the Figure. An input signal, typically a current signal, is supplied to current mirror 20 on line 56 which is first coupled to cascode circuit 50. An output signal (which mirrors that of the input signal) is generated on line 62. As illustrated, the source voltage supplied on line 44 is also coupled to cascode circuit 50.

FIG. 2 is a circuit diagram of the cascode circuit 50, shown in block form in FIG. 1, of a preferred embodiment of the present invention. The block representing circuit 50 in FIG. 1 is shown in hatch in FIG. 2. Input and output lines 56 and 62, respectively, of current mirror 20 of FIG. 1 are similarly numbered in the circuit diagram of FIG. 2. As illustrated, coupled to line 56 are resistor 68 and capacitor 74 connected in a parallel connection therewith. Sides of the parallel-connected, resistor-capacitor combination 68–74 are coupled theretogether to form line 80.

Cascode circuit 50 further comprises transistor 86 which, as illustrated, also is preferably comprised of a MOSFET. The gate electrode of transistor 86 is coupled to input line 56, a source electrode of transistor 86 is coupled to line 92, and the body of transistor 86 is coupled to line 98. Lines 80 and 92 provide connection to the drain electrodes of first and second transistors 26 and 32, respectively, of the current mirror 20 of FIG. 1, and line 98 is coupled to line 44 which supplies the source voltage to current mirror 20 thereof.

The circuit diagram of FIG. 3 illustrates a preferred embodiment of the current mirror, here referenced generally by reference numeral 120, of the present invention. Similar to current mirror 20 of FIG. 1, current mirror 120 comprises a transistor pair formed of first transistor 126 and second transistor 132. The gate electrodes of the respective transistors 126 and 132 are connected theretogether, and the gate electrode of transistor 126 is short circuited to the drain electrode thereof by line 138.

A source voltage is supplied to the source electrodes of transistor 126 and 132 on line 144. An input signal may be provided to current mirror 120 on line 156, and an output signal generated by the current mirror 120 may be generated upon output line 162 responsive to such input signal. Line 156 is coupled to the drain electrode of transistor 126 through resistor 168 which is connected in a parallel connection with capacitor 174. Line 156 is additionally coupled to a gate electrode of transistor 186. A drain electrode of transistor 186 is coupled to line 162, a source electrode of transistor 186 is coupled to a drain electrode of second transistor 132, and a body of transistor 186 is supplied with the source voltage supplied to current mirror 120 on line 144.

Current mirror 120 of FIG. 3 further comprises a tandemly-positioned transistor pair formed of transistor 204 and transistor 210. As illustrated, transistor 204 is a MOSFET, and transistor 210 is a bipolar junction transistor. A gate electrode of transistor 204 is coupled to line 216 which supplies a second source voltage to the gate electrode of the transistor 204. A source electrode of transistor 204 is coupled to an emitter electrode of transistor 210. The channel of transistor 204, and the base and collector electrodes of transistor 210, are coupled to line 144 which supplies the first source voltage to current mirror 120. Additionally, the drain electrode of transistor 204 is coupled to the gate electrodes of the transistor pair comprised of transistor 126–132.

The circuit of current mirror 120 may advantageously be disposed upon an integrated circuit and constructed by a BICMOS process to form a BICMOS integrated circuit. Transistors 126, 132, 186, and 204 formed of MOSFETs, and transistor 210 comprised of a bipolar junction transistor may alternately, of course, be of other transistor constructions. Additionally, although the MOSFETs are, in some instances, shown to be of n-channel constructions, and in other instances to be of p-channel constructions, it is to be noted that the transistor construction of the transistors of current mirror 120 may alternately be of combinations and constructions other than those illustrated.

Responsive to application of an input on line 156, current mirror 120 of the preferred embodiment of the present invention advantageously generates an output pull-up current capable of exhibiting fast rise and fall times while maintaining the current level of the output signal on line 162 in a desired similarity with that of the input signal supplied on line 156 over a wide output voltage range. Current mirror 120 is of a high characteristic output impedance, and high pull-up voltage. (The maximum pull-up voltage of the output voltage level is defined to be the level beyond which the output impedance and the output current of current mirror 120 begins to decrease at a significant rate).

By a circuit evaluation of current mirror 120, it may be determined that the output impedance, $R_{out}$, of current mirror 120 is governed by the following equation:

$$R_{out}=R_2+R_3+G_{m3}R_2R_3$$

wherein:

$R_2$ and $R_3$ are the output impedances of transistors 132 and 186, respectively, and $G_{m3}$ is the transconductance of transistor 186.

The maximum pull-up voltage of current mirror 120 may be determined by a determination of the minimum potential difference required of the gate and source electrodes of the transistor 132 to maintain the output impedance of current mirror 120 at a desired level.

When both transistors 132 and 186 are in saturation (i.e., in a constant current region), the output impedance of the current mirror 120 may be maintained at the desired output impedance over a large range of voltages. When the geometric configurations of transistor 132 and 186 are constructed such that the width to length ratio (w/l) of transistor 186 is greater than the corresponding ration of transistor 132, the relative voltage relationships of transistors 132 and 186 are as follows:

$$2V_{ds(132)}+V_{ds(186)}>2(V_{gs(132)}-V_{t(132)})+V_r$$

and $$V_{ds(132)}>V_r$$

where:

$V_{ds(132)}$ $V_{ds(186)}$ are the drain to source voltages of transistors 132 and 186, respectively;

$V_{gs(132)}$ is the gate to source voltage of transistor 132;

$V_{t(132)}$ is the threshold voltage of transistor 132; and $V_r$ is the voltage across resistor 168 when the current is at a desired, operational level.

In short, when both transistors 132 and 186 are in saturation, the output impedance of the current mirror 120 is high.

When, conversely, transistor 186 is in the linear mode, the relative voltage relationship between the drain-to-source voltage of transistor 186 and the voltage drop across transistor 168 is as follows:

$$V_r>V_{ds(186)}+V_{t(186)}-V_{t(132)}$$

wherein the voltages are as defined hereinabove.

When transistor 186 is in the linear mode, in a conventional cascode arrangement, the output impedance of current mirror 120 is low, and degradation of output current occurs.

By selecting the resistive value of resistor 168 such that the potential difference thereacross is between the saturation voltages of transistors 132 and 186, the output voltage capability of current mirror 120 is of a level within the voltage drop across resistor 168 summed with the drain-to-source voltage drop (in saturation) across transistor 132 of the voltage level of the source voltage supplied on line 144. Resistor 168, therefore, effectively "pushes" the operation point of transistor 132 further into the saturation region of the transistor.

Therefore, even when the output voltage of current mirror 120 is great enough such that transistor 186 is operative in the linear region, the output current level of current mirror 120 may be maintained. Hence, by varying the voltage across resistor 168 and the width to length ratios of transistors 132 and 186, a pull-up voltage of a level within one volt, or even a fraction thereof, of the source voltage level of the source voltage supplied on line 144 is possible without commensurate reduction of output impedance or increase of gate capacitance of the transistors.

Capacitor 174, connected in a parallel connection with resistor 168, is operative to prevent discharge currents generated through the gate electrodes of transistor 126 and 132 from altering the voltage level at the gate electrode of transistor 186. Such a discharge current could result in current overshoot or current undershoot of the current level at the drain electrode of transistor 186. A narrow discharge current pulse of a high value, in the absence of capacitor 174, is supplied directly to resistor 168 which can result in a voltage increase across resistor 168 and a resultant lowering of the voltage at the gate electrode of transistor 186 to induce, thereby, a channel in transistor 186. An undesirable, and sharp, drain current overshoot at transistor 186 can result. Coupling of the capacitor 174 across resistor 168, prevents such current overshoot at transistor 186. It is noted that, when current mirror 120 is to be operative for generating a high current output, positioning of capacitor 174 across resistor 168 is especially advantageous.

Transistor 204, comprised of a MOSFET, and transistor 210, comprised of an NPN-bipolar junction transistor advantageously forms a portion of current mirror 120 to decrease the turn-on and turn-off times of current mirror 120.

A MOSFET, such as transistor 126, typically has a threshold voltage of about one volt while a bipolar transistor, such as transistor 210, typically has a threshold voltage of about 0.7 volts. Because current mirror 120 may be considered to be completely turned-off when a gate-to-source voltage of transistors 126 and 132 are less than the respective threshold voltages, the supply voltage minus the junction voltage of a bipolar transistor can be used as the reference voltage to which the gates of transistors 126 and 132 rise during turnoff instead of the supply voltage, hence reducing the turn-off time.

When application of a current signal on line 156 is discontinued, the voltage at the gates of transistors 126 and 132 rises to approach the source voltage which, for purposes of example, is here of nine volts. The gate voltage of transistors 126 and 132 during application of a current signal on line 156 is 7.5 volts. When the current signal is discontinued on line 156, the voltage rises to the source voltage minus a diode drop (i.e., the threshold voltage, $V_t$, of bipolar transistor 210), rather than nine volts, and the turn off time of current mirror 120 is decreased.

When a current signal is again applied to line 156, because of the 0.7 volt threshold voltage of transistor 210, the voltage at the gates of transistors 126 and 132 decreases from 8.3 volts to 7.5 to turn on the current mirror. As the voltage decrease is only 0.8 volts (rather than 1.5 volts if the gate voltages of transistors 126 and 132 had risen to the source voltage of nine volts), the turn on time of the current mirror is decreased.

Positioning of transistor 204, such that the source electrode thereof is coupled to the emitter electrode of transistor 210, and the drain electrode of transistor 204 is coupled to the gate electrodes of transistors 126–132, transistor 204 is operative to "turn-off" current mirror 120 by forming a switch to apply the current of transistor 210 at a falling edge of an input pulse applied to current mirror 120 on line 156. The level of the transistor 210 current decreases significantly once the voltage of gate electrodes of transistors 126 and 132 are within a level of the source voltage less the base-to-emitter voltage of transistor 210.

When the input signal supplied on line 156 to current mirror 120 is comprised of a pulse train of current pulses, and are, hence, repetitive, the voltage level of the gate electrodes of transistors 126–132 are maintained at a constant level until the switch formed of transistor 204 is once again turned off at a rising edge of a subsequent input pulse on line 156.

As the voltage level of the gate electrodes of transistors 126–132 is not of a voltage level corresponding to the voltage of the source voltage supplied on line 144 during circuit turn-off, the time required to reduce the voltage level at the gate electrodes of transistors 126–132 to turn on transistors 126–132 and, hence, the current mirror 120, is decreased. A signal supplied on line 216 to the gate of transistor 204 is preferably generated by a second source voltage. Therefore, a level shifter is preferably coupled between the second source voltage and the gate to ensure that the voltage at the gate is within a proper range. If the level shifter is comprised of a CMOS circuit, because the gate delay through a CMOS level shifter is less than that of an NPN current mirror (such as the current mirror shown in FIG. 7 to be described hereinbelow), a signal supplied on line 216 is supplied to transistor 126 before a corresponding input current signal is supplied thereto on line 156 through resistor 168. Therefore, current supplied by transistor 210 by closing the switch formed thereof to the gate electrodes of transistors 126 and 132 almost immediately causes current mirror 120 to be turned off and/or on, respectively, responsive to the current levels of the input signal supplied on line 156. Therefore, the combination of transistor 204 and transistor 210 advantageously reduces the turn-on and turn-off time of current mirror 120.

Turning now to the graphical representation of FIG. 4, an output current signal generated by current mirror 120 of FIG. 3 is plotted as a function of time, wherein ordinate axis 250 is scaled in terms of current, and abscissa axis 256 is scaled in terms of time. Plot 262 represents an output current signal generated on line 162 responsive to application to current mirror 120 on line 156 of a pulse train of current pulses. Also plotted upon the axis system defined by axes 250 and 256 are waveform 268 and, shown in hatch, waveform 272.

Waveform 268 is representative of a signal generated by a conventional current mirror circuit responsive to application of the input pulse train thereto. The rise times and fall times of waveform 262 are significantly less than the rise times and fall times of waveform 268 as a result of operation of the transistor pair 204–210 of current mirror 120 of the present invention.

Waveform 272, shown in hatch, represents a waveform generated responsive to a corresponding input signal to current mirror 120 of the present invention in the absence of capacitor 174 connected across resistor 168. Significant distortion of the signal results, caused by discharge currents generated at gate electrodes 126 and 132 of current mirror 120. Such distortion is prevented by placement of capacitor 174 across resistor 168.

FIG. 5 is a block diagram of a charge pump, referred to generally by reference numeral 300, of a preferred embodiment of the present invention. Two current mirrors 120 of FIG. 3 comprise portions of charge pump 300. Such current mirrors are indicated in the block diagram of FIG. 5 by blocks referenced by reference numerals 310 and 320, respectively. Source voltages are applied to current mirrors 310 and 320 by connection of current mirrors 310 and 320 to line 326. Line 326 of FIG. 5 corresponds to line 144 of current mirror 120 of FIG. 3. Input signals, here input current signals, are supplied to current mirrors 310 and 320 on lines 332 and 338, respectively; such lines correspond to line 156 of current mirror 120 of FIG. 3. Output signals generated by current mirrors 310 and 320 are generated on lines 344 and 350, respectively; such lines correspond to line 162 of FIG. 3. Also, input lines 356 and 362 are coupled to current mirrors 310 and 320, respectively; such lines correspond to line 216 of FIG. 3.

Charge pump 300 further includes voltage level shifting circuits 380 and 410 which generate output voltage signals on lines 356 and 362, respectively. Level shifting circuits 380 and 410 are coupled to receive the source voltage by connections thereof to line 326. Additionally, level shifting circuits 380 and 410 are coupled to a secondary source voltage by connections thereof to line 416. Details of operation of level shifting circuits 380 and 410 will be discussed more fully hereinbelow.

Charge pump 300 further includes current setting circuits 420 and 450. Current setting circuits 420 and 450 generate output signals on lines 332 and 338, respectively, which form input lines coupled to the respective ones of current mirrors 310 and 320. Current setting circuits 420 and 450 are additionally coupled to line 416 and the secondary source voltage supplied thereat.

Current setting circuit 420 additionally receives an input supplied thereto on line 456, as does voltage level shifting circuit 380. Similarly, current setting circuit 450 receives an input signal supplied thereto on line 462, as does voltage level shifting circuit 410. Current setting circuits 420 and 450 are described in more detail hereinbelow.

Charge pump 300 additionally includes a current mirror, represented by block 470 for "down currents". Current mirror 470 is coupled to receive the output signals generated by current mirrors 310 and 320. Current mirror 470 is operative to provide proper polarity of pull-down currents generated by current mirror 320.

FIG. 6 is a circuit diagram of voltage level shifting circuit 380 of FIG. 5. Level shifting circuit 410 of FIG. 5 is identical to that of level shifting circuit 380 and may be similarly represented. Level shifting circuit 380 is comprised of cascaded, tandemly-positioned MOSFETs 382, 384, 386, 388, 390, 392, 394, and 396. As illustrated, transistors 382 and 384 are PMOS transistors, and transistors 386–396 are NMOS transistors. Source electrodes of transistors 382 and 384 are coupled to a source voltage supplied thereto on line 398, as are the gate electrodes of transistors 386 and 388. The bodies of transistors 382 are also coupled to the source voltage supplied on line 398. Drain electrodes of transistors 382 and 384 are coupled to coupled to drain electrodes of transistors 386 and 388, respectively. Source electrodes of transistors 386 and 388 are coupled to drain electrodes of transistors 390 and 392, respectively; similarly, source electrodes of transistors 390 and 392 are coupled to drain electrodes of transistors 394 and 396, respectively. Gate electrodes of transistors 390 and 392 are coupled to secondary source voltage input line 400. Also, the gate electrode of transistor 394 is coupled to input line 402. Bodies of transistors 386–396 are coupled theretogether to common ground. Inverter 404 additionally interconnects gate electrodes of transistors 394 and 396. Inverter 404 is operative to form a proper polarity between the gates of transistors 394 and 396.

Level shifting circuit 380 is operative to shift an input voltage signal supplied thereto to a desired level to turn on and to turn off the transistors of transistor pair 204–210 of current mirrors 310 and 320. As the supply voltage of the source voltage supplied on line 398 differs from that of the source voltage supplied on line 400, care must be exercised to reduce the deleterious effects of a hot electron effect when the source voltage of the signal supplied on line 398 is greater than that of the signal supplied on line 400. Stacking of transistors 386–392 reduces such hot electron effect wherein the gate electrodes of transistors 386 and 388 are tied to the source voltage on line 398, and the gate electrodes of transistors 390 and 392 are coupled to the source voltage supplied on line 400. The output voltage generated on line 408 swings between values of ground and the source voltage of line 398. Signals generated on line 408 correspond to the signals generated on lines 356 and 362, which are supplied to current mirrors 310 and 320, respectively.

Figure 7:
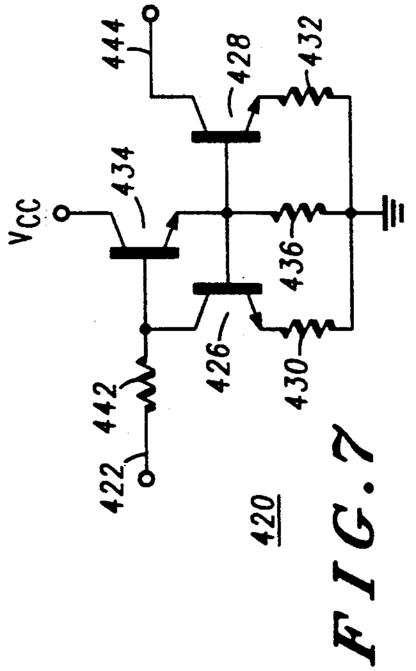
FIG. 7 is a circuit diagram of another portion of the charge pump of FIG. 5.

The circuit diagram of FIG. 7 is that of current setting circuit 420, shown in block form in FIG. 5. Current setting circuit 450 is identical in construction, and therefore may be similarly illustrated. Current setting circuit 420 is operative to convert an input voltage pulse supplied thereto on line 422 into a current pulse of a specific value. Current setting circuit 420 comprises a transistor-pair formed of first transistor 426 and second transistor 428 which are connected theretogether at base electrodes thereof. Resistor 430 is coupled between an emitter electrode of transistor 426 and ground; similarly, resistor 432 is coupled between an emitter electrode of transistor 428 and ground. Resistor 436 is coupled between the commonly-connected base electrodes of transistors 426–428 and ground. An emitter electrode of transistor 434 is coupled to the base electrodes of transistors 426 and 428; a collector leg of transistor 434 is coupled to a positive supply voltage (i.e., the source voltage) and the base electrode of transistor 434 is coupled to the input line 422 through resistor 442. The collector electrode of transistor 426 is coupled to the base electrode of transistor 434. Output line 444 of current setting circuit 420 is coupled to a collector electrode of transistor 428.

The output current level of circuit 420 is determined mainly by resistor 442, and also by the ratio of the sizes of transistor 428 and resistor 432 to the sizes of transistor 426 and resistor 430. Proper selection of the circuit elements results in an output current on line 444 which is twice the level of the input current supplied thereto on line 422. Additionally, the values of resistors 430 and 432 are selected such that, when the output current level is of a desired value, the potential difference across resistors 430 and 432 is approximately one quarter volt. At such a condition, the output impedance of transistors 426 and 428 increases by a factor of approximately ten over their respective output impedances exclusive of resistors 430 and 432.

Transistor 434 is operative to compensate for the base current loss of transistors 426 and 428. Resistor 436 increases the breakdown voltage between the emitter and collector electrodes of transistor 428; additionally, resistor 436 is operative to improve the transient response of the transistor pair 426–428.

As the current level is proportional to the input voltage of the voltage signal supplied thereto on line 422, and the output impedance of current setting circuit 420 is of a high value, the output current level of the current signal generated on line 444 does not change when the output current signal generated on line 444 is supplied to other portions of charge pump 300 of FIG. 5. Transistors 426 and 428 together form a conventional current mirror, and the output current generated on line 444 has overshoot and undershoot. The slower transient response of metal oxide semiconductor field effect transistors (MOSFETs) comprising current mirrors 310 and 320 of the charge pump removes such overshoot and undershoot.

Figure 8:
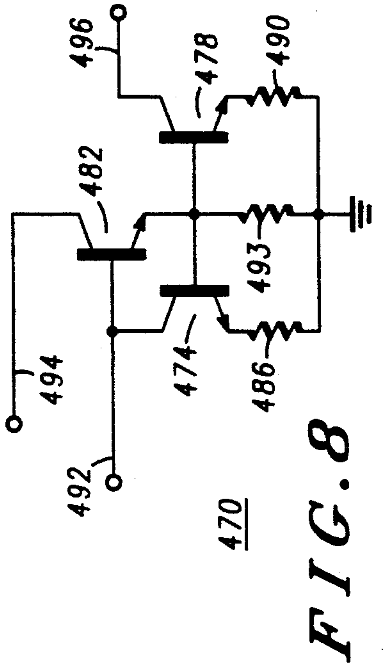
FIG. 8 is a circuit diagram of yet another portion of the block diagram of FIG. 5.

FIG. 8 is a circuit diagram of current mirror 470 of charge pump 300 of FIG. 5. Current mirror 470 is similar in construction to that of current setting circuit 420 shown in the circuit diagram of FIG. 7. Current mirror 470, accordingly, is comprised of transistors 474, 478, and 482 which correspond to transistors 426, 428, and 434 of FIG. 7. Resistors 486, 490, and 493 correspond to resistors 430, 432, and 436 of FIG. 7. Input signals are supplied to current mirror 470 on lines 492 and 494, and an output signal is generated on line 496. The circuit of FIG. 8 differs from that of FIG. 7 only in that signals are supplied thereto on lines 492 and 494. Operation of circuit 470 is otherwise similar to that previously described with respect to FIG. 7 and will not be again described in detail.

Figure 9:
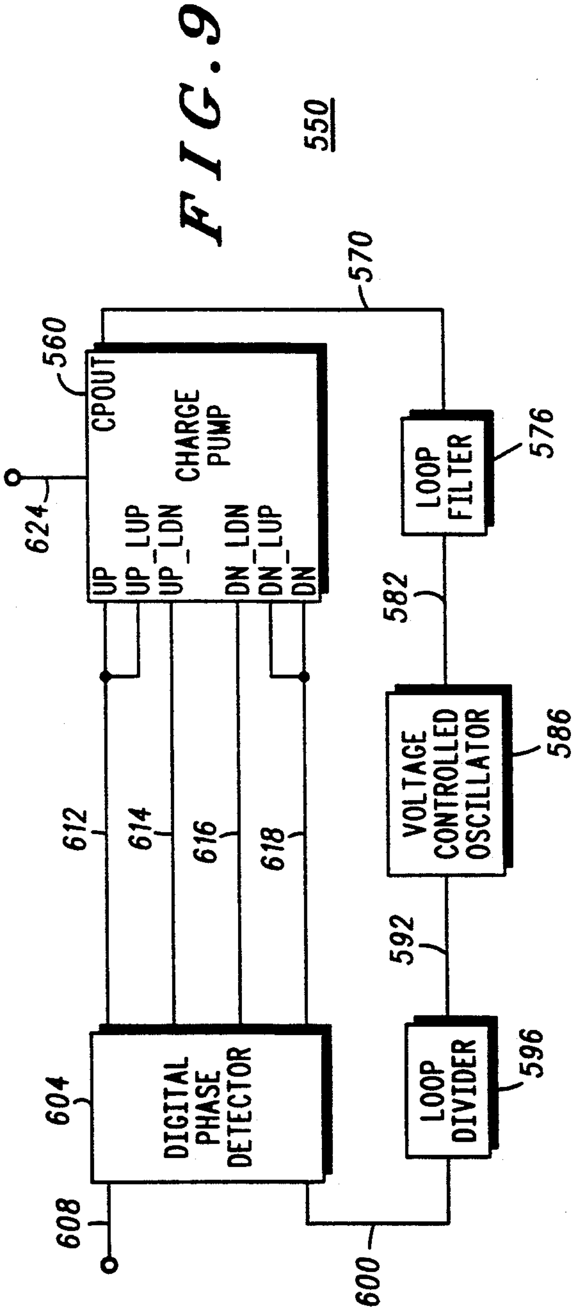
FIG. 9 is a block diagram of a phase locked loop of a preferred embodiment of the present invention in which the charge pump of FIG. 5 forms a portion thereof.

Turning now to the block diagram of FIG. 9, charge pump 300, shown in block form in FIG. 5 and described in greater detail in FIGS. 6-8 hereinabove, forms a portion of a phase locked loop, referred to generally by reference numeral 550. An output signal generated by the charge pump, here indicated by reference numeral 560, on line 570, is supplied to filter 576. Filter 576 generates a filtered signal on line 582 which is supplied to voltage controlled oscillator (VCO) 586. The value of the signal supplied to oscillator 586 on line 582 alters, or warps, the frequency of the oscillating signal generated by the oscillator. The oscillating signal generated by oscillator 586 is generated on line 592 which is sampled by loop divider circuit 596. Loop divider circuit 596 divides the signal supplied thereto on line 592, and generates a signal on line 600 which is supplied to phase detector 604. In the preferred embodiment of phase locked loop 550, as illustrated, phase detector 604 comprises a digital phase detector. An oscillating signal (also divided in frequency by circuitry similar to loop divider 596) is additionally supplied to phase detector 604 on line 608. Digital phase detector 604 compares the frequencies (and, hence, phases) of the signals supplied thereto on lines 600 and 608 and generates output signals on lines 612, 614, 616, and 618 responsive to such comparison. Lines 612-618 are coupled to charge pump 560. Charge pump 560 of phase locked loop 550 further includes line 624 for supplying a source voltage thereto.

Phase locked loop 550 is operative to warp the frequency of oscillator 586 to correspond to the frequency of the oscillating signal generated by a reference oscillator and supplied to phase detector 604 on line 608. When the oscillating signals supplied to phase detector 604 on lines 600 and 608 are out of phase, phase detector 604 generates signals indicative thereof on lines 612-618. Charge pump 560, having current mirrors of the present invention forming portions thereof, generates output current signals indicative of the signals applied thereto. The values of such output signals are supplied to filter 576 and then to oscillator 586 on line 582 to warp the oscillating frequency of the oscillator 586.

As the phase, and hence frequency, of the oscillator 586 is warped to match the oscillating frequency of the oscillating signal supplied on line 608 to phase detector 604, the signals generated on lines 612-618 by phase detector 604 indicates such correspondence. Responsive to such signals generated on lines 612-618, the signal generated by charge pump 560 on line 570 (and supplied to filter 576, and then to oscillator 586) prevents additional warping of oscillator 586.

Figure 10:
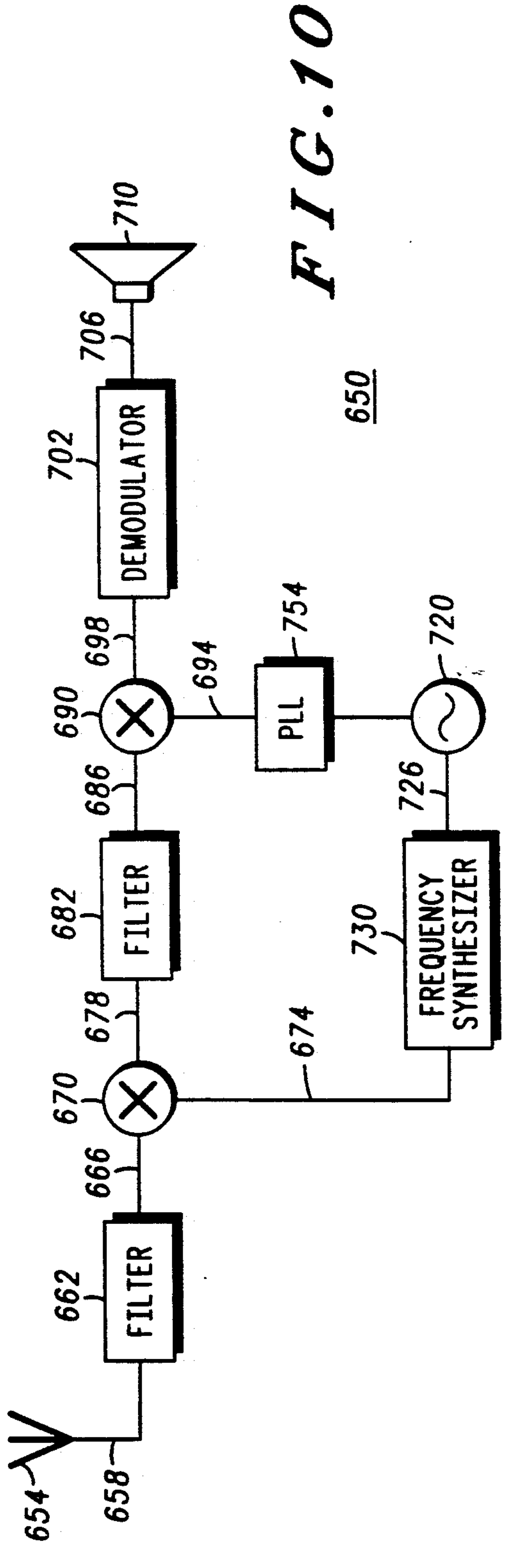
FIG. 10 is a block diagram of a receiver of which the phase locked loop of FIG. 9 forms a portion thereof.

FIG. 10 is a block diagram of a receiver, referred to generally by reference numeral 650, of a preferred embodiment of the present invention. Receiver 650 includes current mirrors similar in construction to current mirror 120 of FIG. 3.

Antenna 654 of receiver 650 receives radio-frequency, electromagnetic wave signals and converts such signals into electrical signals on line 658. Line 658 is coupled to filter circuit 662 which generates a filtered signal on line 666 having frequency component portions within the passband of filter 662. Line 666 is coupled to mixer 670 which also receives a down-converting mixing signal on line 674.

Mixer 670 generates a first down-converted signal on line 678 which is supplied to filter 682. Filter 682 generates a filtered signal on line 686 which is coupled to mixer 690. Mixer 690 receives a second down-converted, oscillating signal on line 694 to down-convert the signal supplied to mixer 690 on line 686. Mixer 690 generates a second, down-converted signal on line 698 which is supplied to demodulator 702. Demodulator 702 generates a demodulated signal on line 706 which is supplied to a transducer, such as speaker 710.

Receiver 650 further includes a reference oscillator 720 which generates on oscillating signal of a reference frequency on line 726 which is supplied to frequency synthesizer 730. Frequency synthesizer 730 includes circuitry similar to phase detector 604, charge pump 560, loop filter 576, VCO 586, and loop divider 596 of the phase locked loop 550 of FIG. 9. Frequency synthesizer 730 generates a signal on line 674 which is supplied to mixer 670. The oscillating signal generated by reference oscillator 720 is also coupled to phase locked loop 754, and phase locked loop 754 is coupled to mixer 690 on line 694. Phase locked loop 754 maintains the signal on line 698 in a frequency relationship with reference oscillator 720.

Figure 11:
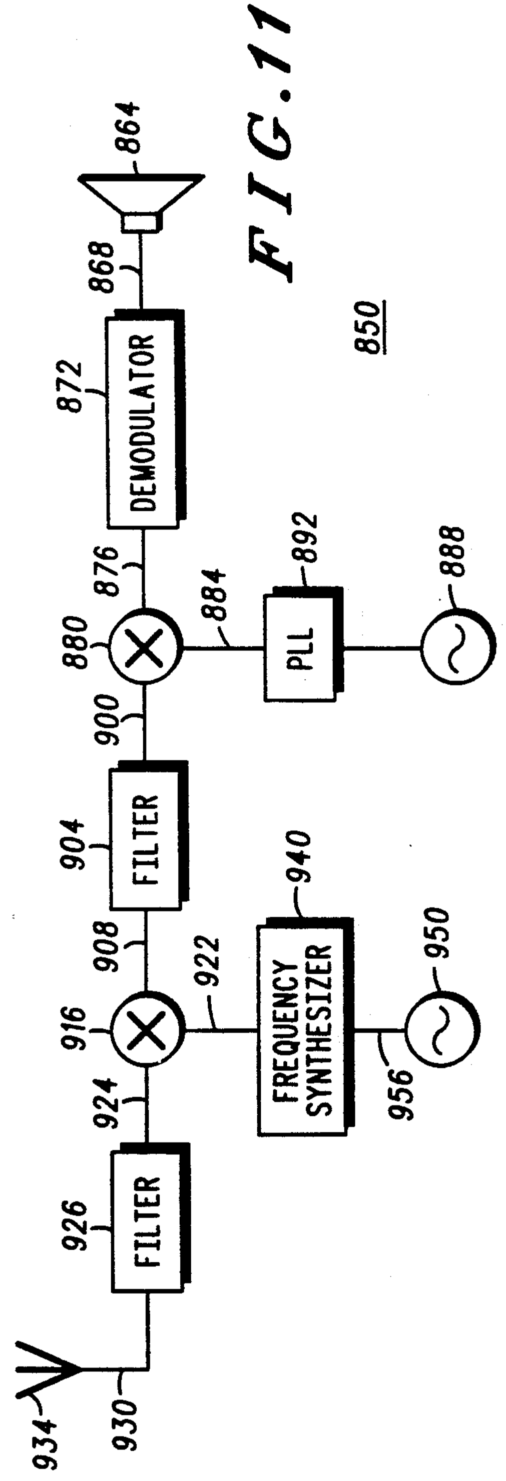
FIG. 11 is a block diagram of a transmitter having a phase locked loop forming a portion thereof.

FIG. 11 is a block diagram of a transmitter, referred to generally by reference numeral 850, of a preferred embodiment of the present invention. Transmitter 850 comprises current mirrors similar to current mirror 120 of FIG. 3 to form portions thereof.

A transducer of transmitter 850, such as microphone 864 converts a signal, such as a voice signal into electrical form on line 868 which is supplied to modulator 872. Modulator 872 generates a modulated signal on line 876 which is supplied to mixer circuit 880. Mixer 880 additionally receives an oscillating signal on line 884 generated by oscillator 888 through a phase locked loop circuit, referred to in block form by block 892. Mixer 880 up-converts the modulated signal supplied thereto on line 876, and generates a first up-converted signal on line 900 which is supplied to filter 904. Filter 904 generates a filtered signal on line 908 having frequency component portions within the bandwidth of the passband of filter 904. Line 908 is coupled to second mixer 916 which also receives an oscillating signal on line 922. The oscillating signal supplied on line 922 to mixer 916 is generated by programmable synthesizer 940 which contains elements corresponding to phase locked loop 550 of FIG. 9. Synthesizer 940 contains a charge pump having current mirrors similar to current mirror 120 of FIG. 3. Synthesizer 940 is coupled to reference oscillator 950 on line 956. Line 956 of FIG. 11 corresponds with line 608 of loop 550 of FIG. 9. Mixer 916 generates a second up-converted signal on line 924 which is supplied to filter 926. Filter 926 generates a filtered signal on line 930 which is supplied to antenna 934 to radiate the signal therefrom.

While the present invention has been described in connection with the preferred embodiments shown in the various figures, it is to be understood that other similar embodiments may be used and modifications and additions may be made to the described embodiments for performing the same functions of the present invention without deviating therefrom. Therefore, the present invention should not be limited to any single embodiment, but rather construed in breadth and scope in accordance with the recitation of the appended claims.

What is claimed is:

1. A current mirror supplied with a source voltage for generating an output signal of desired current characteristics responsive to an input current signal supplied thereto, said current mirror comprising:

a parallel-connected transistor pair coupled to the source voltage, the parallel-connected transistor pair being comprised of a first transistor and a second transistor wherein the first transistor and the second transistor are of similar threshold voltages, and wherein the first transistor and the second transistor are commonly connected theretogether to form a common junction therebetween;

a cascode circuit coupled to the parallel-connected transistor pair, said cascode circuit having means of a pre-determined impedance and an output transistor commonly connected theretogether at first sides thereof, said first sides thereof further being coupled to receive the input current signal, said means for the pre-determined impedance being coupled at a second side thereof to the first transistor of the parallel-connected transistor pair and to the common junction formed between the first transistor and the second transistor thereof, and said output transistor being connected at a second side thereof in tandem with the second transistor of the at least one transistor pair whereby the output signal of the desired current characteristics of high impedance is generated at a third side of the output transistor; and a switching circuit comprised of a first switching transistor and a second switching transistor positioned in tandem therewith, wherein said first switching transistor is coupled to the source voltage, wherein said second switching transistor is coupled to the common junction of the parallel-connected transistor pair, and wherein one of the first and second switching transistors, respectively, is a diode-connected transistor having a threshold voltage less than the threshold voltages of the first and second transistors of the parallel-connected transistor pair, and the other one of the first and second switching transistors is operative to turn on in the absence of the input current signal such that, in the absence of the input current signal, voltage levels at the common junction formed between the first and second transistors of the parallel-connected transistor pair rises to a voltage level of the source voltage less a voltage drop across the diode-connected transistor, thereby to reduce time periods required to turn off the first and second transistors of the parallel-connected transistor pair.

2. The current mirror of claim 1 wherein said current mirror is formed of a bipolar complementary metal oxide semiconductor (BICMOS) integrated circuit.

3. The current mirror of claim 2 wherein said parallel-connected transistor pair is formed of a metal oxide semiconductor, field effect transistor (MOSFET)-pair having commonly-connected gate electrodes.

4. The current mirror of claim 1 wherein said means for supplying the input signal comprises a resistor of a pre-determined resistive value.

5. The current mirror of claim 1 further comprising means forming a charge storage element connected in parallel with said means of the predetermined impedance.

6. The current mirror of claim 1 wherein said output transistor of the cascode circuit is comprised of a metal oxide semiconductor field effect transistor (MOSFET).

7. The current mirror of claim 6 wherein a gate terminal of the metal oxide semiconductor field effect transistor (MOSFET) comprising the output transistor is coupled to receive the input current signal.

8. The current mirror of claim 1 wherein said first switching transistor of the switching circuit is comprised of a biopolar transistor material.

9. The current mirror of claim 1 wherein said second switching transistor of the switching circuit is comprised of a metal oxide semiconductor field effect transistor (MOSFET).

10. The current mirror of claim 9 further comprising a switching, biasing voltage source coupled to a gate electrode of the second switching transistor.

11. The current mirror of claim 1 wherein said threshold voltage of the first switching transistor is of a value less than a threshold voltage of the second switching transistor.

12. A bipolar, complementary metal oxide semiconductor (BICMOS) current mirror supplied with a source voltage for generating an output signal of desired current characteristics responsive to an input current signal supplied thereto, said current mirror comprising:

a parallel-connected transistor pair formed of first and second metal oxide field effect transistors (MOSFETs) connected theretogether at gate electrodes thereof to form a common junction therebetween, said first and second MOSFETs having source electrodes thereof coupled to receive said source voltage; and a cascode circuit coupled to said parallel-connected transistor pair, said cascode circuit having: a parallel-connected resistor-capacitor pair coupled at a first side thereof to a drain electrode of the first transistor of the parallel-connected transistor pair and at a second side thereof to receive the input current signal, and an output, metal oxide semiconductor field effect transistor coupled in tandem with the second MOSFET of the parallel-connected transistor pair, said output transistor having a gate electrode coupled to the first side of the resistor-capacitor pair, thereby to receive said input signal; and a switching circuit comprised of a first switching transistor and a second switching transistor positioned in tandem therewith, wherein said first switching transistor is coupled to the source voltage and is of a threshold voltage less than the threshold voltages of the first and second MOSFETs, respectively, of the parallel-connected transistor pair, and wherein said second switching transistor is coupled to the common junction of the parallel-connected transistor pair and operative to turn on in the absence of the input current signal such that, in the absence of the input current signal, voltage levels at the common junction formed between the first and second MOSFETs of the parallel-connected transistor pair rises to voltage level of the source voltage less a voltage drop across the first switching transistor, thereby to reduce time periods required to turn off the first and second transistors of the parallel-connected transistor pair.

13. The current mirror of claim 12 further comprising a switch circuit comprised of a tandemly-connected transistor pair wherein a first transistor of the tandemly-connected transistor pair has a first characteristic turn-on voltage, and a second transistor of the tandemly-connected transistor pair has a second characteristic turn-on voltage.

14. A frequency synthesizer circuit comprising:

means forming a reference oscillator for generating an oscillating signal defining a reference frequency;

means forming a phase detector coupled to receive a signal proportional to the oscillating signal generated by the reference oscillator and a second oscillating signal for comparing phases of said signal proportional to the oscillating signal and for generating a phase difference signal responsive to comparisons therebetween;

means forming a charge pump coupled to receive the phase difference signal for generating an output current signal responsive to the value of the phase difference signal received thereat; said charge pump supplied with a source voltage and having: at least one parallel-connected transistor pair coupled to receive said source voltage comprised of a first transistor and a second transistor of similar threshold voltages and being commonly connected theretogether to form a common junction therebetween; a cascode circuit coupled to said at least one parallel-connected transistor pair, said cascode circuit for receiving the phase difference signal, and having means of a pre-determined impedance and an output transistor commonly connected theretogether at first sides thereof, said first sides thereof further being coupled to receive the input signal, said means for the pre-determined impedance being coupled at a second side thereof to the first transistor of the parallel-connected transistor pair and to the common junction formed between the first transistor and the second transistor thereof, and said output transistor being connected at a second side thereof in tandem with the second transistor of the at least one transistor pair whereby the output signal of the desired current characteristics of high impedance is generated at a third side of the output transistor; and a switching circuit comprised of a first switching transistor and a second switching transistor positioned in tandem therewith, wherein said first switching transistor is coupled to the source voltage and is of a threshold voltage less than the threshold voltages of the first and second transistors, respectively, of the parallel-connected transistor pair, and wherein said second switching transistor is coupled to the common junction of the parallel-connected transistor pair and operative to turn on in the absence of the input current signal such that, in the absence of the input current signal, voltage levels at the common junction formed between the first and second transistors of the parallel-connected transistor pair rises to a voltage level of the source voltage less a voltage drop across the first switching transistor, thereby to reduce time periods required to turn off the first and second transistors of the parallel-connected transistor pair;

means forming a filter coupled to received the output current signal generated by the charge pump and for generating a filtered signal responsive thereto; and means forming a voltage controlled oscillator for generating a voltage-controlled oscillating signal defining an oscillator frequency, said voltage controlled oscillator formed therefrom having means for receiving the filtered signal for altering an oscillating frequency of the voltage controlled oscillator, and wherein a signal proportional to the voltage-controlled oscillating signal forms the second oscillating signal supplied to the phase detector.

* * * * *